(12) United States Patent
Han (10) Patent No.: US 10,645,801 B2
(45) Date of Patent: May 5, 2020

(54) ADHESIVE AND FLEXIBLE DISPLAY USING THE SAME

(71) Applicant: LG Display Co., Ltd., Seoul (KR)

(72) Inventor: Mi-Jin Han, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/209,687

(22) Filed: Dec. 4, 2018

(65) Prior Publication Data

US 2019/0191543 A1    Jun. 20, 2019

(30) Foreign Application Priority Data

Dec. 20, 2017    (KR) .................. 10-2017-0176467

(51) Int. Cl.
*H01L 51/52* (2006.01)
*H01L 27/32* (2006.01)
*H05K 1/02* (2006.01)
*H05K 1/11* (2006.01)
*H01L 51/00* (2006.01)

(52) U.S. Cl.
CPC .......... *H05K 1/028* (2013.01); *H01L 51/0097* (2013.01); *H01L 51/5237* (2013.01); *H01L 51/5253* (2013.01); *H05K 1/118* (2013.01); *H01L 27/3244* (2013.01); *H01L 2251/5338* (2013.01)

(58) Field of Classification Search
CPC .... H05K 1/028; H05K 1/118; H01L 51/5237; H01L 27/3244; H01L 2251/5338; H01L 51/0097; H01L 51/5253
See application file for complete search history.

(56) References Cited

U.S. PATENT DOCUMENTS

| | | | |
|---|---|---|---|
| 2014/0231763 A1* | 8/2014 | Kim .................... | H01L 27/3218 257/40 |
| 2016/0303843 A1* | 10/2016 | Jang .................... | B32B 37/0084 |
| 2020/0028113 A1* | 1/2020 | Jeong .................. | H01L 51/5237 |

* cited by examiner

*Primary Examiner* — Edward Chin
(74) *Attorney, Agent, or Firm* — Seed IP Law Group LLP (57) ABSTRACT

Provided are an adhesive and a flexible display including the same. The adhesive can avoid deformation and can easily return to the original state thereof upon unfolding by including an adhesive sheet on both surfaces thereof and performing treatment on specific areas to change the rigidity thereof and make the areas different in rigidity and thereby form a plurality of neutral planes.

17 Claims, 8 Drawing Sheets

ADHESIVE AND FLEXIBLE DISPLAY USING THE SAME

CROSS-REFERENCE TO RELATED APPLICATION(S)

This application claims the benefit of Korean Patent Application No. 10-2017-0176467, filed on Dec. 20, 2017, which is hereby incorporated by reference as if fully set forth herein.

BACKGROUND

Technical Field

The present disclosure relates to a flexible display, more particularly, to an adhesive which can prevent detachment at the interface and easily return to an original state even after repeated folding by conducting certain treatment on an adhesive sheet and a flexible display including the same.

Description of the Related Art

Image displays for displaying a variety of information on a screen are core technologies in the information technology era and are being developed into slimmer, lighter weight and higher-functional forms. In response to these requirements, organic light emitting diodes and the like, which are capable of spontaneously emitting light and thus do not require a light source unit, attract much attention as flat panel display devices capable of reducing weight and volume, which are drawbacks of cathode ray tubes.

Organic light emitting displays display an image through a plurality of pixels arranged in the form of a matrix. Each pixel includes a light emitting element and a pixel driving circuit including a plurality of transistors independently operating the light emitting elements.

Meanwhile, recently, in terms of various applications, there is increasing demand for a flexible display that can be easily carried in a pocket or a small pouch and can display an image on a larger screen as compared to when carried. Flexible displays are folded or bent partly when carried or stored, whereas they are opened when displaying an image, so that an image display area can be increased and a more realistic image can be provided to a user.

A display panel, on which an image is displayed, can be slimmed by decreasing the thickness of a substrate.

In addition, a flexible display includes a back plate disposed under a foldable or bendable flexible display panel to support the display panel and mount the same in a case. The display panel and the back plate are produced through different processes and can be bonded together via an adhesive interposed therebetween because both have no adhesive property.

In this regard, since a general adhesive is made of a single material for a sheet such as rubber, it has a problem of suitably failing to respond to folding or bending of display panels. In addition, when an adhesive is made of a material having similar flexibility to the display panel or the back plate by controlling the rigidity thereof, there is a problem that the adhesive exerts adhesion only on the surface where the display panel contacts the back plate so that they can contact each other via a high attractive force, but opposite surfaces of the adhesive are deformed by the difference in length variation, and when different attractive forces such as shrinkage and expansion are generated during operation such as folding, the adhesive cannot return to the original condition.

Hereinafter, a folded state of a flexible display according to Comparative Example will be described.

Figure 1:
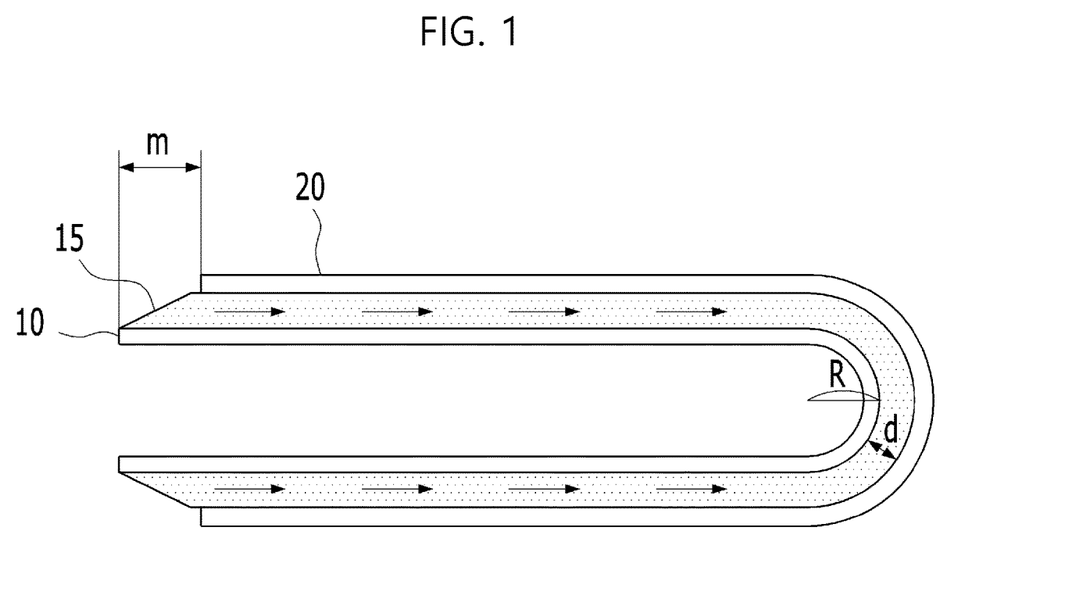
FIG. 1 is a sectional view illustrating a folded state of a flexible display according to Comparative Example.

FIG. 1 is a sectional view illustrating a folded state of a flexible display according to Comparative Example.

As shown in FIG. 1, the flexible display according to Comparative Example includes a display panel 10 and a back plate 20 which are bonded together via an adhesive 15 interposed between the entire surfaces thereof. In this case, when the flexible display is folded in half, the display panel 10 folded inside and the back plate 20 folded outside have different radiuses of curvature in the folding region. Accordingly, the display panel 10 and the back plate 20 overlap while having the same size in a non-folded state, whereas, in a folded state, the display panel 10 and the back plate 20 expand while having different radiuses of curvature in a folding region and an area where the back plate 20 having a larger radius of curvature does not overlap the display panel 10, corresponding to the expansion, in a non-folding region of both ends, is formed. This phenomenon is referred to as "slip" between the display panel 10 and the back plate 20.

In addition, during such a folding operation, a first surface and a second surface of the adhesive 15, which contact the display panel 10 and the back plate 20, respectively, have a strain m at opposite ends thereof due to the difference between adhesive surfaces. A sum of strains 2m at two ends is defined as a difference in folding length between the first surface and the second surface.

When the distance (radius of curvature) from the center of the folding region of the display panel 10 to the first surface of the adhesive 15 is set to "R", the folding region has a semicircular cross-sectional surface. For this reason, the length of the folding region on the first surface contacting the display panel 10 corresponds to "πR". In addition, when the thickness of the adhesive 15 is set to "d", the length of the folding region on the second surface contacting the back plate 20 corresponds to "π(R+d)". Accordingly, the equation of 2m=π(R+d)−πR is obtained.

The adhesive 15 is interposed over the entire surface between the display panel 10 and the back plate 20. Since in the flexible display according to Comparative Example, the adhesive 15 does not have similar flexibility to the display panel 10 or the back plate 20, when the folded flexible display is opened (unfolded) again, the adhesive has difficulty returning to the original state. In this case, a long time is required for the display to return to the original state thereof or it is impossible to unfold the folding region even after a long time and thus return to the original flat flexible display.

Meanwhile, the aforementioned entire-surface-type adhesive according to the flexible display of Comparative Example can easily return to the original state thereof by improving the rigidity thereof. However, when the rigidity of the adhesive is excessively strong, disadvantageously, the display panel may crack upon repeated folding and unfolding due to increased stress applied to the relatively flexible display panel. In addition, an entire-surface-type adhesive with reduced rigidity takes an excessively long time from a time at which the strain 2m occurs until returning to the original state, despite being unfolded, after folding. An adhesive property is deteriorated at the interface between the display panel contacting the adhesive, and the back plate, thus being disadvantageously inapplicable to devices.

In addition, in the case of a general polymer adhesive, the difference in length variation between an inside surface and an outer surface of the general polymer adhesive occurs when slip occurs by folding between both adherends, and then remains as permanent deformation. Accordingly, upon removal of folding stress, the difference in length between both surfaces of the polymer adhesive between adherends, which are flush with each other, is observed as buckling, wrinkling or deformation in a certain part in a flexible display and is seen as a defect to viewers.

BRIEF SUMMARY

Accordingly, the present disclosure is directed to an adhesive and a flexible display including the same that substantially obviate one or more problems due to limitations and disadvantages of the related art.

An object of the present disclosure is to provide an adhesive which can avoid deformation and can easily return to the original state thereof upon unfolding by including an adhesive sheet on both surfaces thereof and performing treatment on specific areas to change the rigidity thereof and make the areas different in rigidity and thereby form a plurality of neutral planes.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

The adhesive and the flexible display according to the present disclosure can maintain flatness of the adhesive sheet and is provided with a plurality of neutral planes by making areas different in rigidity through specific treatment, so that the adhesive can prevent slip between both adherends upon bending or folding of a device and can improve restoration to an original state thereof.

To achieve these objects and other advantages and in accordance with the purpose of the disclosure, as embodied and broadly described herein, an adhesive includes an adhesive sheet having a first surface and a second surface opposing each other and including a plurality of first regions, each having a first rigidity between the first surface and the second surface, and a second region having a second rigidity different from the first rigidity between the first regions, and a first release film and a second release film adhered to the first surface and the second surface, respectively.

The first rigidity may be 10-fold to 1,000-fold higher or lower than the second rigidity.

The first surface and the second surface may have adhesivity.

The first region may have a polygonal or cylindrical shape, and the first region and the second region may have identical heights.

An aspect ratio of the first region along a folding axis may be 1:1 or higher.

A length of the first region may be greater than a length of the second region between the first regions.

In another aspect of the present disclosure, provided is a flexible display including a display panel comprising a thin film transistor, an organic light emitting diode array and a encapsulation layer for sealing the thin film transistor and the organic light emitting diode array, a back plate facing the display panel and including a folding region and a non-folding region, and the adhesive described above, between the display panel and the back plate.

The first regions of the adhesive may be provided in the same folding region as the display panel and the back plate.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to the preferred embodiments of the present disclosure, examples of which are illustrated in the accompanying drawings. In the following description of the present disclosure, substantially the same elements are denoted by the same reference numerals. In the following description, when detailed description of well-known technologies or configurations relating to the present disclosure is deemed to unnecessarily make the subject matter of the present disclosure unclear, detailed explanation thereof will be omitted. In addition, names of constituent components used in the following description may be different from part names of actual products because they are selected in consideration of convenience in drafting the specification.

In addition, in the description of embodiments, it will be understood that, when one element or layer is referred to as being "on" or "above" another element, one element may directly contact the other element or layer, or one or more intervening elements or layers may also be present between the two elements or layers. In addition, when one element or layer is referred to as "contacting" another element, one or more intervening elements are not present between the two elements or layers.

The sizes and thicknesses of respective elements are illustrated in the drawings for convenience of description and the present disclosure is not necessarily limited to the sizes and thicknesses thereof.

Hereinafter, preferred embodiments of the present disclosure will be described with reference to the annexed drawings.

The display illustrated in the following embodiments represents a foldable display, but a folding region may be located in any part of the display. In the flexible display according to the present disclosure, the location of deformation of a back plate in the folding region can be changed depending on change of the folding region of the flexible display. In addition, the flexible display according to the present disclosure may also be called "foldable", "bendable", "rollable" or the like so long as it is flexible regardless of a bent or folded region.

Figure 2:
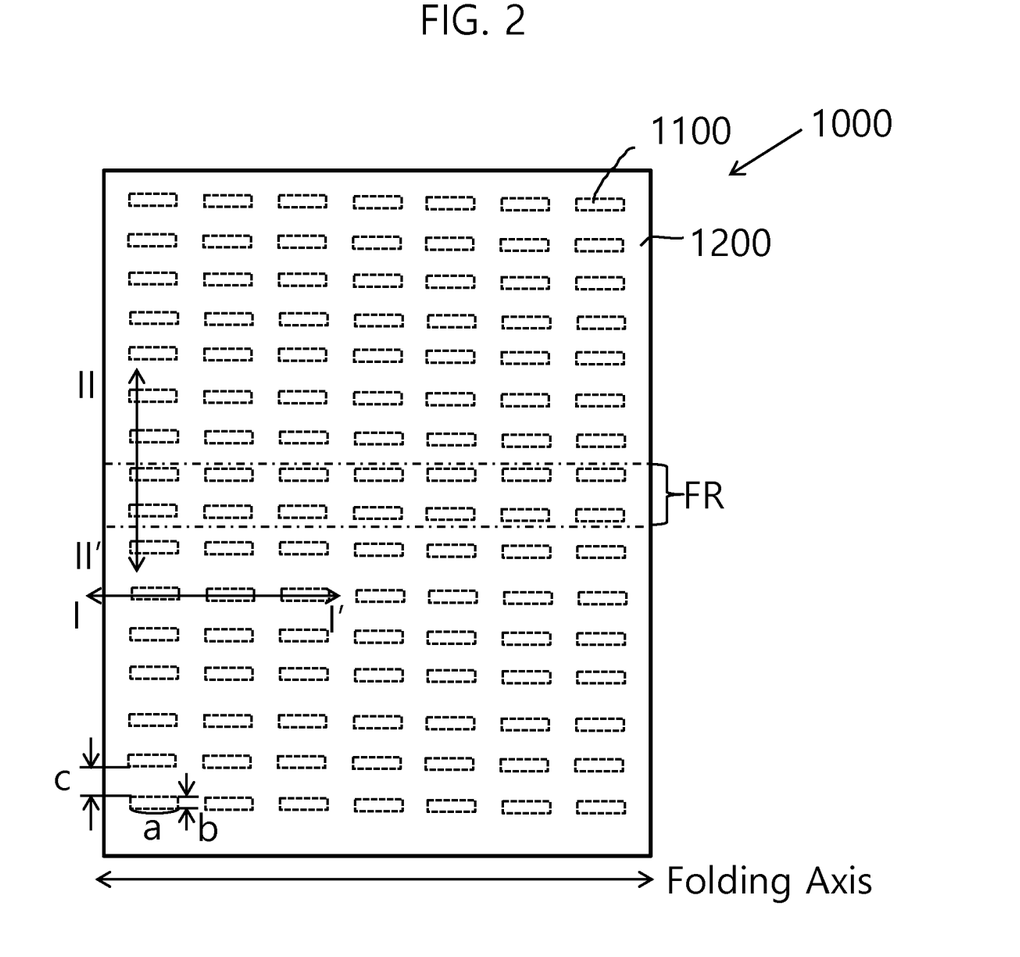
FIG. 2 is a plan view illustrating an adhesive according to the present disclosure.
Figure 3:
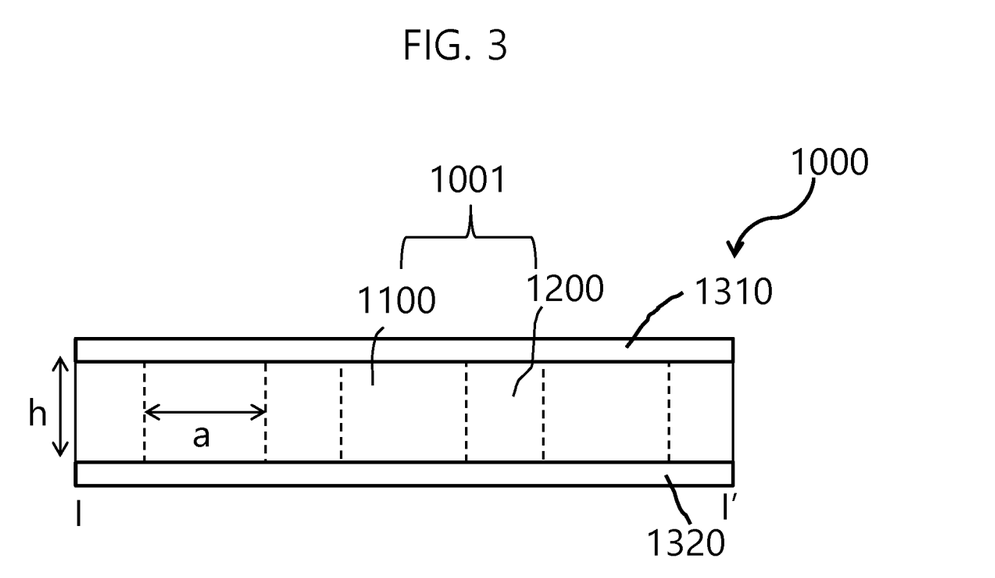
FIG. 3 is a sectional view taken along line I-I' of FIG. 2.
Figure 4:
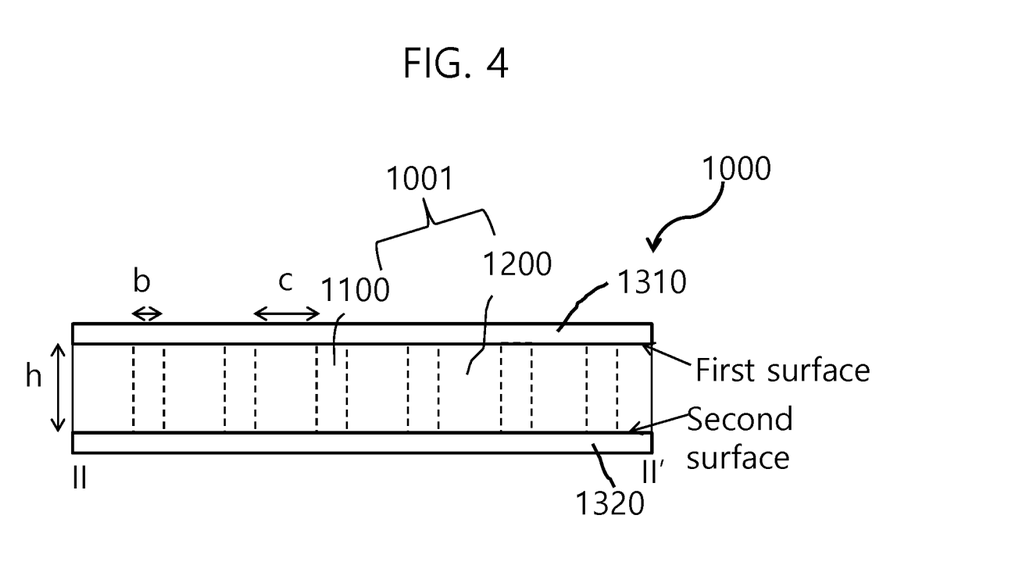
FIG. 4 is a sectional view taken along line II-II' of FIG. 2.
Figure 5:
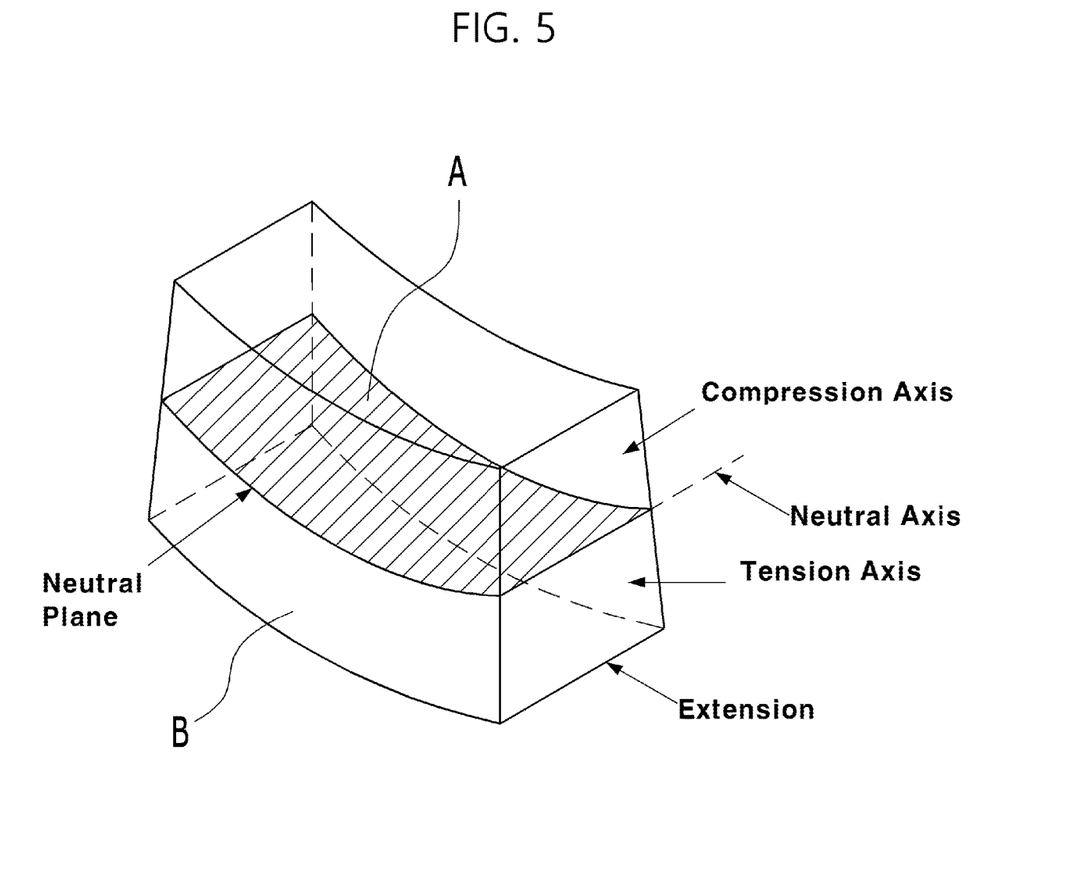
FIG. 5 is a perspective view illustrating a neutral plane.

FIG. 2 is a plan view illustrating an adhesive according to the present disclosure, FIG. 3 is a sectional view taken along line I-I' of FIG. 2, FIG. 4 is a sectional view taken along line II-II' of FIG. 2 and FIG. 5 is a perspective view illustrating a neutral plane.

As shown in FIGS. 2 to 4, the adhesive 1000 according to the embodiment of the present disclosure includes an adhesive sheet 1001 which has a first surface and a second surface opposing each other, and includes a plurality of first regions 1100, each having a first rigidity between the first surface and the second surface, and a second region 1200 having a second rigidity different from the first rigidity between the first regions, and a first release film 1310 and a second release film 1320, which are adhered to the first surface and the second surface, respectively.

Here, the first release film 1310 and the second release film 1320 are removed, when the adhesive corresponds to two adherends, and function to protect adhesivity of the first surface and the second surface and to prevent the first and second surfaces from being exposed to foreign matters.

In addition, the adhesive sheet 1001 is a kind of film which has an overall predetermined thickness and adhesivity on both surfaces thereof. The adhesive sheet 1001 includes a base binder resin selected from the group consisting of a polyurethane(meth)acrylate resin, a polyurethane resin, a poly(meth)acrylate resin and a combination thereof, and a rubber resin oriented with the base binder resin. The resin, which is basically a main ingredient, has adhesivity. Accordingly, when the release films 1310 and 1320 are removed and both surfaces of the adhesive sheet 1001 contact the adherends, the adhesive sheet 1001 can maintain the adhesion state without another member.

In addition, the adhesive sheet 1001 may have a thickness of about 10 μm to 100 μm. The adhesive sheet 1001 of the adhesive 1000 according to the present disclosure is a layer substantially conducting adhesion, when removing the first release film 1310 and the second release film 1320, is a physically integrated sheet having excellent support performance and can be thus implemented by a small thickness, so that the adhesive sheet 1001 is preferably formed to a thickens of about 50 μm or less in a flexible display.

The primary feature of the adhesive of the present disclosure is that the adhesive sheet 1001 has different rigidities among regions.

As illustrated in the drawing, the adhesive sheet 1001 includes a plurality of first regions 1100 each having a first rigidity and a second region 1200 having a second rigidity smaller than the first rigidity between the first regions. In addition, as illustrated in the drawing, the first region 1100 is patterned and divided into sections of the first region, and the second region 1200 fills the gaps between the first regions 1100. Accordingly, the second region 1200 is an integrated form. However, in some cases, the first region 1100 may be integrated and the second region 1200 may be patterned.

Here, the first region 1100 and the second region 1200 are integrated and not physically divided, and one of the first and second regions 1100 and 1200 is subjected to certain treatment to provide a higher or lower rigidity than the rigidity of the original material. For example, in the following testing, the certain treatment may be an ultraviolet (UV) irradiation. The UV irradiation is useful for modifying mechanical properties of predetermined regions in the adhesive sheet because it can provide modification with linearity only in certain regions, unlike heat application or chemical permeation which may cause modification of other regions due to transfer of heat or chemical additive to the other regions.

Other useful methods may include but not limited to, apart from UV irradiation, application of an electric or magnetic field.

Meanwhile, the adhesive of the present disclosure has different rigidities among regions of the adhesive sheet 1001 because, by distributing the first regions 1100 having different rigidities, a plurality of neutral planes are provided between the first surface and the second surface of the adhesive, so that, after the shape of the adhesive 1000 is changed by application of different forces, that is, contraction and expansion, to the first and second surfaces, the adhesive 1000 can return to the original state, without permanent deformation and with an improved restoration rate. Here, the improvement in restoration rate of the adhesive 1000 according to the present disclosure is realized by forming a plurality of neutral planes, which enable the force between the first surface A where contraction occurs and the second surface B where expansion occurs to be zero when contraction and expansion, which are stresses different from each other, are applied to the first surface and the second surface of the adhesive sheet 1001, respectively, as shown in FIG. 5.

For example, when the first rigidity of the first region 1100 is higher than the second rigidity of the second region 1200, neutral planes may be formed in the first region 1100. As a result, when the adhesive 1000 according to the present disclosure is folded in half, a part of a folding region (see FR of FIG. 7) where contraction and expansion forces are distributed is wider and the speed of unfolding is faster, upon removal of a folding strength from the adhesive of the present disclosure, as compared to a single sheet-type adhesive. Here, the presence of more neutral planes means less strain in the adhesive 1000 and thus faster return to the original state.

As shown in FIGS. 2 to 4, the first region 1100 has high rigidity through modification based on certain treatment and the second region 1200 maintains the original rigidity of the adhesive sheet 1001.

In addition, the adhesive 1000 according to the present disclosure includes the first region 1100 and the second region 1200 which are continuously connected to each other and have the same height (h). When the certain treatment is, for example, UV treatment, an irradiation region of the first region 1100 may be not less than a predetermined level due to limitation of devices.

However, in order to optimize the effects of a plurality of neutral planes obtained by the first region 1100, the first region 1100 may have a height (h) and a critical dimension (a or b) in a ratio of 1:1. In addition, in response to the recent trend towards slimmer flexible displays, the adhesive 1000 should have a height (h) not more than a predetermined level. For example, when the height of the adhesive 1000 is about 25 μm, both a and b determining an area of the first region 1100 should be about 25 μm or less, so that the volume of the region implemented by the first region 1100 should be about $25^3$ μm$^3$ or less.

Meanwhile, when planarly observing the first region 1100 and the second region 1200, if a length of a first side of the first region 1100 along a folding axis and a length of a second side crossing the first side are set to "a" and "b", respectively, the first region 1100 and the second region 1200 are observed as planar rectangles, but the present disclosure is not limited thereto and the planar shape of the first and second regions 1100 and 1200 may be an oval, circular, or other polygonal shape, apart from the rectangular shape. In addition, here, the first region 1100 is shown as a predetermined cylindrical shape in vertical cross-section, but the present disclosure is not limited thereto and the first region 1100 may take a jar shape having both bulging sides or an hourglass shape having both recessed sides based on certain treatment.

Preferably, when a folding operation substantially occurs, strong contraction and expansion occur in a part of the folding region (FR) crossing the folding axis, the length b of the second side on which the contraction and expansion act is designed to be as smaller as possible than the length a of the first side along the folding axis, so that a plurality of neutral planes can effectively function at the intersection between the first region 1100 and the folding axis. In a crossing direction to the folding axis, adjacent first region 1100 is spaced at a distance c.

In addition, upon UV irradiation, an upper surface of the first region, which corresponds to the first surface relatively close to the irradiation region, and a lower surface of the first region, which corresponds to the second surface far from the irradiation region, may have different areas.

Meanwhile, there may be a difference of about 10-fold to 1,000-fold between the first rigidity of the first region 1100 and the second rigidity of the second region 1200.

The first rigidity of the first region 1100 different from the second region 1200 is, for example, not less than about $10^5$ Pa and is less than about $10^8$ Pa, and the second rigidity of the second region 1200 is about 10-fold to 1,000-fold higher or lower than the first rigidity and is, for example, not less than about $10^4$ Pa and less than about $10^7$ Pa, in a case wherein the second rigidity is lower than the first rigidity.

Meanwhile, in consideration of neutral planes, UV irradiation is chosen as treatment conducted in a certain region of the adhesive sheet 1001 regarding the adhesive of the present disclosure for the following reasons.

The applicant of the present disclosure conducted testing including space-division patterning an adhesive layer to form a patterned adhesive layer in another embodiment to form neutral planes on the adhesive.

In the following testing, the patterned adhesive layer is formed using the same materials while changing an aspect ratio, to check variations between designed values and formed patterns. Here, one of the adherends was a back plate.

In Table 1, 'D' means a width having critical properties of a pattern (the largest length in the horizontal cross-section of the pattern) and 'H' means a height of the pattern. In addition, regarding the aspect ratio (a ratio of vertical length to a horizontal length), 'vertical length' means height (h) and 'horizontal length' means a width. In addition, an increase of the aspect ratio to 1:1 or higher means that the width is equal to the height, or the height is greater than the width.

By adjusting the aspect ratio to 1:1 or more, preferably, the height of the pattern can be equal to the width of the pattern, or the height of the pattern can be larger than the width of the pattern. However, the height of the pattern has practical limitations in consideration of slimness of devices. As can be seen from the test results shown in Table 1, as the aspect ratio of the pattern increases, the variation between the designed values and measured values of formed pattern increases.

In the testing, the designed value of height h of the pattern is set to 50 μm and the width (D) of the pattern is changed. That is, the first pattern-type adhesive sets a designed value of the width (D) of the pattern to 200 μm, the second pattern-type adhesive sets a designed value of the width (D) of the pattern to 150 μm, the third pattern-type adhesive sets a designed value of the width (D) of the pattern to 100 μm, and measured values of the width and the height observed from the upper surface of the back plate and the pattern are evaluated.

This testing shows that, when the height of the pattern is in a similar level and the area of the pattern is decreased, the pattern cannot maintain the height thereof and is bent or damaged by pressure.

Meanwhile, the measured values D and H are different between the back plate part and the patterned part. The measured values D and H of the back plate part are obtained by measuring the width and height (thickness) of the surface of the back plate part contacting the pattern, while the measured values D and H of the patterned part are obtained by measuring the width and height (thickness) of the upper surface of the pattern not contacting the back plate. The differences between the measured values are due to the fact that the pattern is not uniformly formed, like a cylinder.

In addition, the pattern-type adhesive has an empty area between patterns and has problems in which the empty area is exposed to foreign matters, causing contamination, and the pattern and the empty area have optically different effects due to difference in specific gravity, thus being visible from the outside.

The adhesive of the present disclosure can solve the aforementioned problems of the pattern-type adhesive, in particular, maintain properties of the adhesive sheet and at the same time, secure a plurality of neutral planes based on difference in rigidity, improve reliability upon repeated

TABLE 1

|  |  | First pattern-type adhesive | | Second pattern-type adhesive | | Third pattern-type adhesive | |
|---|---|---|---|---|---|---|---|
|  |  | Back plate | Pattern | Back plate | Pattern | Back plate | Pattern |
| Designed value ([D μm](D:H) | | [200] (1:0.25) | | [150](1:0.33) | | [100](1:0.5) | |
| Measured value | D | 255 | 228 | 201 | 219 | 147 | 132 |
|  | H | 30 | 22 | 31 | 3.5 | 28 | 9.3 |
|  | D:H | 1:0.11 | 1:0.1 | 1:0.15 | 1:0.02 | 1:0.19 | 1:0.07 | folding operations and protect permeation of dust or moisture, thus being stably kept as an adhesive.

In an attempt to solve the drawbacks of the pattern-type adhesive, the adhesive of the present disclosure is provided with a plurality of regions having different rigidities so that neutral planes can be increased, at the same time, the second regions 1200 having lower rigidity than first regions 1100 fill the gaps between the first regions 1100, and the major issue of the pattern-type adhesive, that is, shape-retaining ability, can thus be resolved.

Hereinafter, a method for producing the adhesive of the present disclosure will be described.

Figure 6A:
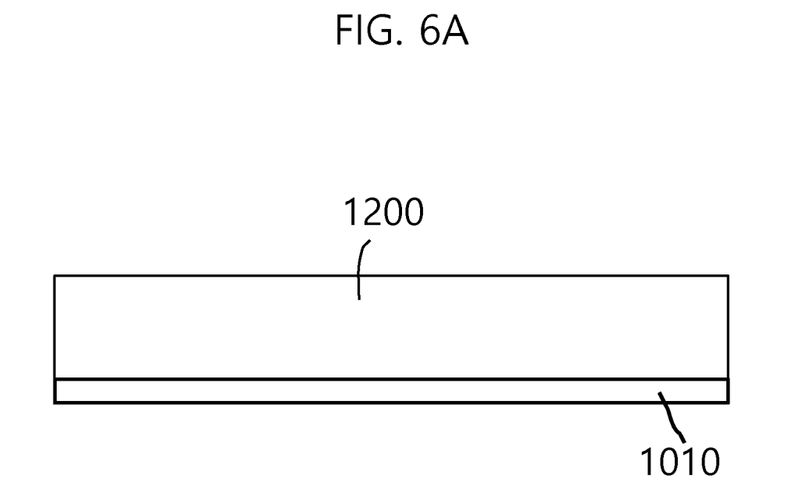
FIGS. 6A to 6C are sectional views illustrating a method for producing the adhesive of the present disclosure.
Figure 6B:
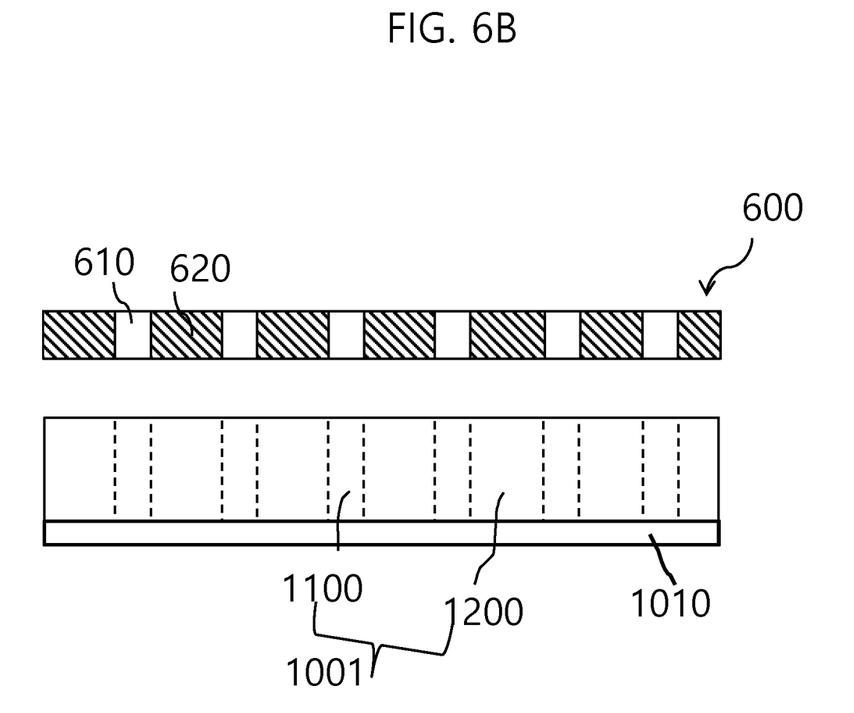
Figure 6C:
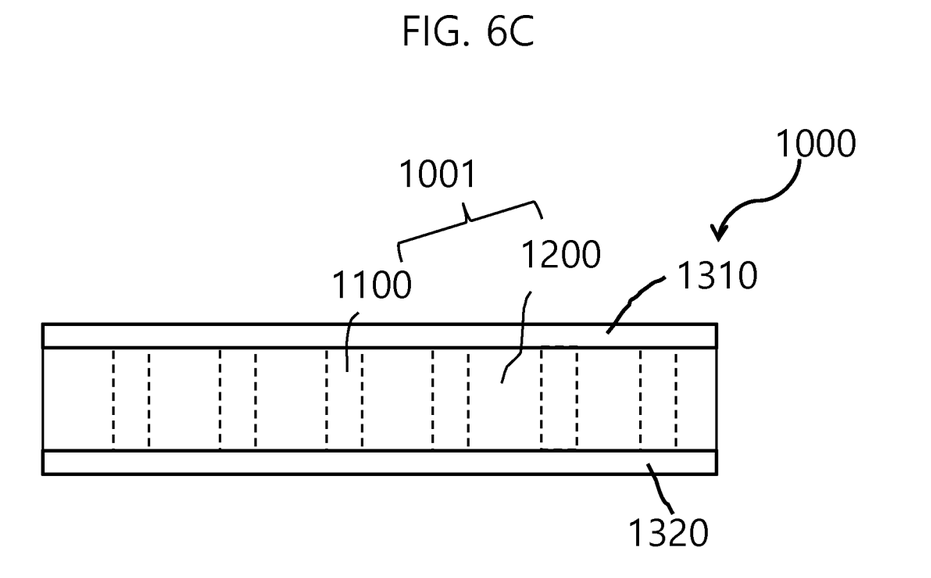

FIGS. 6A to 6C are sectional views illustrating a method for producing the adhesive of the present disclosure.

As shown in FIG. 6A, an adhesive material 1200 having a predetermined second rigidity is loaded on a substrate 1010.

Then, as shown in FIG. 6B, a mask 600 having an opening 610 is loaded between light-shielding parts 620, and UV is irradiated to the adhesive sheet 1200 through the mask 600 such that the UV-irradiated region is physically modified into a first region 1100 having a first rigidity higher than a second rigidity, and the remaining non-irradiated region functions as a second region 1200 of the original adhesive sheet, and the adhesive sheet 1001 having the second region 1200 filling the gaps between the first regions 1100 remains on the substrate 1010.

Meanwhile, upon physical modification through UV irradiation, the intensity of UV irradiation can be determined depending on the properties of ingredients of the adhesive material, and the distribution of first regions 1100 and the size of individual first regions 1100 can be determined depending on requirements for neutral planes.

As shown in FIG. 6C, the adhesive sheet 1001 is removed from the substrate 1010 and both surfaces of the adhesive sheet 1001 are covered with the first release film 1310 and the second release film 1320 to protect the adhesive sheet 1001 and thereby form the adhesive 1000.

In some cases, the substrate 1010 may be used as the second release film 1320.

Hereinafter, whether or not the adhesive 1000 according to the present disclosure can be formed will be described based on the results shown in the following Table 2.

TABLE 2

| Items | Second region rigidity (at 25° C.) | First region rigidity after UV (at 70° C.) |
|---|---|---|
| First sample | 6.0 × 10$^4$ Pa | 5.2 × 10$^6$ Pa |
| Second sample | 2.7 × 10$^4$ Pa | 1.51 × 10$^6$ Pa |
| Third sample | 1.7 × 10$^4$ Pa | 9.7 × 10$^5$ Pa |
| Fourth sample | 1.3 × 10$^4$ Pa | 1.4 × 10$^6$ Pa |

As can be seen from Table 2, the samples have rigidity of the second region before UV treatment and, after UV treatment at a temperature of 70° C., the third sample showing the least variation undergoes a 57.06-fold increase in rigidity and the second sample showing the largest variation undergoes a 559-fold variation in rigidity. This test confirmed that substantially different UV treatment among regions can result in variation of difference in rigidity.

Here, the temperature required for UV treatment can change depending on material for the sample and can be conducted at room temperature (for example, about 25° C.). In addition, the change speed of rigidity among regions can control the content of photoinitiator contained in the respective samples.

In addition, the adhesive sheet 1001 according to the present disclosure can retain the adhesivity of both surfaces thereof even after UV treatment and is modified to have a difference in rigidity among regions.

Hereinafter, an example in which the adhesive 1000 or adhesive sheet 1001 according to the present disclosure is applied to a flexible display will be described.

Figure 7:
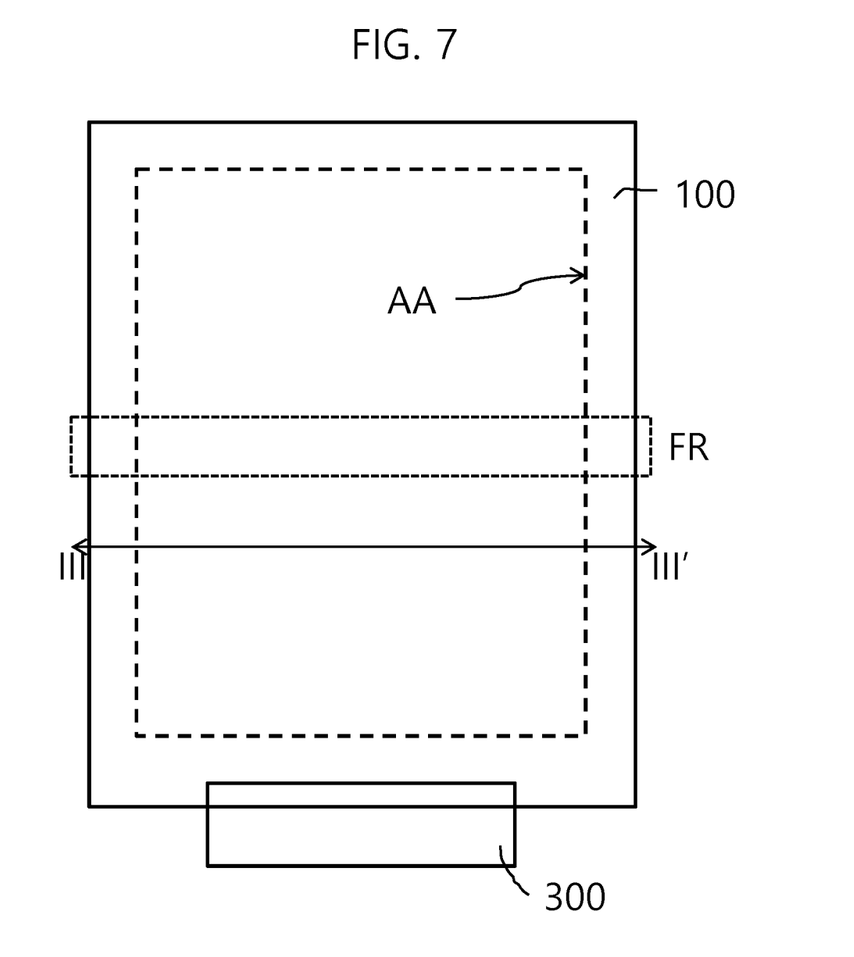
FIG. 7 is a plan view illustrating a flexible display according to the present disclosure.
Figure 8:
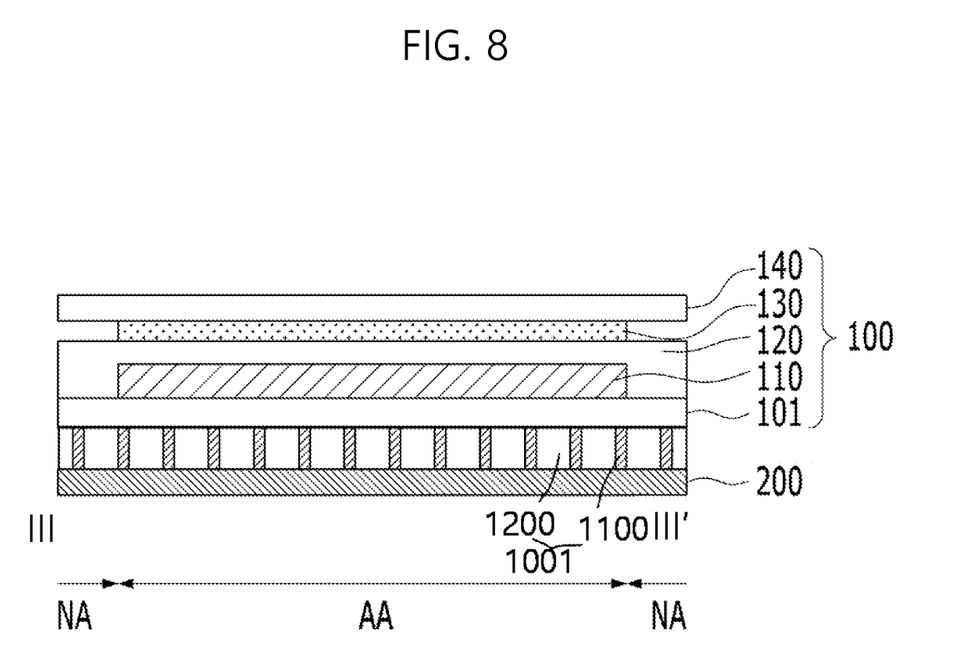
FIG. 8 is a sectional view taken along the line III to III' of FIG. 7.

FIG. 7 is a plan view illustrating a flexible display according to the present disclosure and FIG. 8 is a sectional view taken along line III to III' of FIG. 7.

As shown in FIGS. 7 and 8, the flexible display according to the present disclosure includes a display panel 100, a back plate 200 which faces the display panel 100 and supports the bottom of the display panel 100, and an adhesive sheet 1001 having a first region 1100 and a second region 1200, which are separated from each other, depending on rigidity, interposed between the display panel 100 and the back plate 200.

The adhesive sheet 1001 includes a first region 1100 having a first rigidity which is planar and separately divided into a plurality of first regions, and a second region 1200 having a second rigidity lower than the first rigidity and filling the gaps between the first regions 1100. Accordingly, when the display panel 100 and the back plate 200 are folded in a linear direction in a folding region (FR) along a folding axis, and the adhesive sheet 1001, where regions with different rigidities are divided, is folded according to curvature upon folding. At this time, the distribution of spaced first regions 1100 causes formation of a plurality of neutral planes within one adhesive sheet 1001, so that the adhesive has no great strain upon folding and can easily return to the original state thereof at a high rate.

Meanwhile, the display panel 100 of the flexible display according to the present disclosure includes an active area AA which includes a plurality of pixels in the center of the display panel 100 and a non-display area NA which is adjacent to the periphery of the active area AA. In one embodiment, the non-display area NA surrounds the periphery of the active area AA.

In addition, the display panel 100 includes a substrate 101, an array 110 including a thin film transistor and an organic light emitting diode in each subpixel provided in the active area AA, a encapsulation layer 120 which seals the thin film transistor and the organic light emitting diode, a touch electrode array 130 provided on the encapsulation layer 120, and a cover layer 140 which protects the touch electrode array 130.

The substrate 101 and the cover layer 140 may be a thin glass or a plastic film which has a thickness of about 0.2 mm or less and can be flexibly changed in shape without cracking even upon folding. In addition, the substrate 101 and the cover layer 140 may be made of different materials in consideration of light-emission direction and heat-resistance in the process of forming the array 110. When light is emitted upward, the cover layer 140 may be made of, for example, a transparent polymer and the substrate 101 may be made of, for example, a colorful polyimide.

In addition, the array 110 includes a plurality of layers, e.g., an insulation layer, a metal layer and a semiconductor layer etc., formed on the substrate 101, and each layer has a small thickness of about 5,000 Å or less and thus is neither deformed nor cracked even upon folding.

In addition, the encapsulation layer 120 has a thin film laminated which is formed by alternately staking an organic film and an inorganic film and sufficiently covers the top as well as the side surfaces of the active area AA-provided array 110 to prevent exterior moisture, humidity or air and any other foreign matters from permeating into the array 110. In one embodiment, the encapsulation layer 120 is formed on the substrate 101 with a size larger than the active area AA, over the edge of the substrate 101, excluding a side at which a pad electrode (not shown) is provided. In addition, the thicknesses of the organic film and the inorganic film provided in the encapsulation layer 120 are about 3 μm or less and about 1 μm or less, respectively, the total thickness of the encapsulation layer 120 does not exceed about 20 μm, and the uppermost part of the encapsulation layer 120 may be subjected to planarization due to the relatively thick thickness of the organic film.

In addition, a touch electrode array 130 is directly formed on the surface of the flat uppermost part of the encapsulation layer 120 or an additional inorganic protective film is further provided on the encapsulation layer 120, so that the touch electrode array 130 can be provided. In some cases, after the touch electrode array 130 is formed on the inner surface of the cover layer 140, it may be attached to the surface of the encapsulation layer 120.

In addition, the substrate 101 may include a pad part having one side exposed from the encapsulation layer 120. A plurality of pad electrodes are disposed in the pad part and the pad electrodes are connected to a flexible printed circuit board 300. In addition, the flexible printed circuit board 300 is folded toward the bottom of the substrate 101 and is finally accommodated in the structure of a cover bottom (not shown).

Meanwhile, although the back plate 200 having a similar thickness to the substrate 101 is shown in FIG. 8, the back plate 200 is an element which supports a lower part of the substrate 101 and includes a metal as a main ingredient. The back plate 200 has a thickness which is equal to or greater than that of the entire thickness of the display panel 100. In addition, since stainless steel has higher rigidity than the display panel 100 due to the metal material and high thickness, a plurality of openings (not shown) are provided in the folding region (FR), so that the areas provided with the openings serve as springs, making folding easier.

In addition, a skin layer is provided in upper and lower parts of a core layer which includes the openings (not shown) of the back plate 200, so that a step due to the openings can be compensated for and the inner core layer can be protected from exterior shock since the skin layer covers the openings. The core layer is a rigid metal layer, whereas the skin layer is a resin film or inorganic insulation film, which means that the core layer and the skin layer are made of different materials.

Meanwhile, in the flexible display according to the present disclosure, an adhesive sheet 1001 is interposed between, as adherends, the display panel 100 and the back plate 200. Immediately after removal of the adhesive sheet 1001, when the first and second release films 1310 and 1320 correspond to the both adherends 100 and 200 in the adhesive 1000 shown in FIGS. 3 and 4, the first and second surfaces having adhesivity of the adhesive sheet 1001 are adhered to the display panel 100 and the back plate 200, respectively, Meanwhile, the adhesive sheet 1001 according to the present disclosure shown in FIG. 8 may be provided between the cover layer 140 and the touch electrode array 130, or applied to an adhesive layer required for other positions.

In addition, the adhesive according to the present disclosure has the difference in rigidity between first and second regions throughout the entire region, so that it can be applied to a variety of flexible displays such as foldable displays as well as rollable displays or bendable displays, and prevent certain regions from protruding or being damaged due to repeated folding, bending or rolling by maintaining the properties of the adhesive sheet with a constant overall thickness.

In some cases, the adhesive, which is used for structures entailing repeated folding or bending only in certain regions, like foldable displays or bendable displays, may be subjected to local treatment only in certain regions in order to provide first and second rigidities only in the corresponding folding and bending regions.

The adhesive and the flexible display including the same according to the present disclosure have the following effects.

First, the adhesive includes a first region having a first rigidity which is planarly separately divided into a plurality of first regions, and a second region having a second rigidity lower than the first rigidity and filling the gaps between the first regions. Accordingly, when two adherends are folded in a linear direction in a folding region (FR) along a folding axis, the adhesive sheet is folded at a low strain along curvature upon folding because regions with different rigidities are divided. At this time, a plurality of neutral planes are formed, so that the adhesive has little strain upon folding and can easily return to the original state thereof at a high rate.

Second, the difference in rigidity among regions of the adhesive results in formation of a plurality of neutral planes functioning as a pattern, but this difference in rigidity is formed by certain local treatment, regions having a higher rigidity as well as remaining regions have properties of the adhesive sheet and maintain a predetermined thickness, thus effectively supporting the adhesive and improving reliability through protection of permeation of exterior dust or moisture into the adhesive.

Third, the adhesive according to the present disclosure has the difference in rigidity among regions throughout the entire region, so that it can be applied to a variety of flexible displays such as foldable displays as well as rollable displays or bendable displays, and prevent certain regions from remarkably protruding or being damaged due to repeated folding, bending or rolling by maintaining the properties of the adhesive sheet with a constant overall thickness.

In addition, although the preferred embodiments of the present disclosure have been disclosed for illustrative purposes with reference to the annexed drawings, it will be apparent to those skilled in the art that the present disclosure is not limited to the same configurations, actions and effects as the specific embodiments, and various modifications and variations can be made in the present disclosure without departing from the spirit and scope of the disclosure. Accordingly, it is intended that such modifications and alterations fall within the scope of the present disclosure and the true technical protection scope of the disclosure is defined by the technical spirit of the appended claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An adhesive, comprising:
an adhesive sheet having a first surface and a second surface opposing each other, including:
a plurality of first regions;
a second region between the plurality of first regions;
a first release film positioned on the first surface of the adhesive sheet and extending over the plurality of first regions and the second region; and
a second release film positioned on the second surface of the adhesive sheet and extending over the plurality of first regions and the second region,
wherein the plurality of first regions and the second region are positioned in a same layer between the first and the second surface of the adhesive sheet,
wherein the plurality of first regions are spaced apart from each other by a same interval along a folding axis, and
wherein the plurality of first regions each have a first rigidity between the first surface and the second surface, and the second region has a second rigidity lower than the first rigidity between the first surface and the second surface.

2. The adhesive according to claim 1, wherein the first rigidity is about 10-fold to 1,000-fold higher than the second rigidity.

3. The adhesive according to claim 1, wherein the first surface and the second surface have adhesivity.

4. The adhesive according to claim 2, wherein each of the first regions has a polygonal or cylindrical shape, and
each of the first regions and the second region has substantially identical heights.

5. The adhesive according to claim 4, wherein an aspect ratio of each of the plurality of first regions in a direction along the folding axis is 1:1 or higher.

6. The adhesive according to claim 4, wherein a length of each of the first regions is greater than a length of the second region in a direction along the folding axis.

7. The adhesive according to claim 1, wherein the first region and the second region are interposed in an alternating manner at a section.

8. The adhesive according to claim 1, further comprising a plurality of neutral planes positioned between the first surface and the second surface of the adhesive sheet.

9. The adhesive according to claim 8, wherein the positions of the plurality of neutral planes are located based on a difference between the first rigidity of the first regions and the second rigidity of the second region.

10. The adhesive according to claim 1, wherein each of the first regions extend longitudinally along the folding axis.

11. The adhesive according to claim 1, wherein the first regions and the second region are physically integrated in the adhesive sheet.

12. A flexible display, comprising:
a display panel having a thin film transistor, an organic light emitting diode array and a encapsulation layer for sealing the thin film transistor and the organic light emitting diode array;
a back plate facing the display panel and including a folding region and a non-folding region; and
a first adhesive between the display panel and the back plate,
wherein the first adhesive includes a plurality of first regions, each of the first regions having a first rigidity between the display panel and the back plate, and a second region having a second rigidity different from the first rigidity between the first regions, and
wherein the plurality of first regions and the second region are positioned in a same layer, and
wherein the plurality of first regions are spaced apart from each other by a same interval along a folding axis.

13. The flexible display according to claim 12, wherein the first regions of the adhesive are provided in the same folding region as the display panel and the back plate.

14. The flexible display according to claim 12, further comprising:
a cover glass provided on the display panel; and
a second adhesive between the display panel and the cover glass, as an upper adhesive,
wherein the second adhesive comprises an adhesive sheet having a plurality of third regions, each having a third rigidity between the display panel and the cover glass, and a fourth region having a fourth rigidity different from the third rigidity between the display panel and the cover glass.

15. The flexible display according to claim 12, wherein the first regions and the second region between the first regions are positioned in an adhesive sheet commonly having a first surface and a second surface opposing each other.

16. The flexible display according to claim 15, wherein both of the first regions and the second region have adhesivity at the first surface and the second surface.

17. The flexible display according to claim 15, wherein the first regions and the second region directly bond the display panel and the back plate at the first surface and the second surface, respectively.

* * * * *